United States Patent
Fowler et al.

(10) Patent No.: US 8,952,729 B2
(45) Date of Patent: Feb. 10, 2015

(54) SAMPLE AND HOLD CIRCUIT WITH REDUCED NOISE

(71) Applicant: BAE Systems Imaging Solutions, Inc., Nashua, NH (US)

(72) Inventors: Boyd Fowler, Sunnyvale, CA (US); Peter Bartkovjak, San Jose, CA (US)

(73) Assignee: BAE Systems Imaging Solutions Inc., San Jose, CA (US)

( * ) Notice: Subject to any disclaimer, the term of this patent is extended or adjusted under 35 U.S.C. 154(b) by 0 days.

(21) Appl. No.: 13/856,402

(22) Filed: Apr. 3, 2013

(65) Prior Publication Data

US 2014/0300389 A1    Oct. 9, 2014

(51) Int. Cl.
*H03K 5/00* (2006.01)
*H03K 5/1252* (2006.01)
*H03K 17/16* (2006.01)

(52) U.S. Cl.
CPC .............. *H03K 5/1252* (2013.01); *H03K 17/16* (2013.01)
USPC .................................. 327/95; 327/91; 327/96

(58) Field of Classification Search
USPC ..................................................... 327/91–96
See application file for complete search history.

(56) References Cited

U.S. PATENT DOCUMENTS

| 5,296,751 | A * | 3/1994 | Sano ............................... 327/94 |
| 6,424,375 | B1 | 7/2002 | Fowler |
| 6,628,148 | B2 * | 9/2003 | Shirasaki ........................ 327/95 |
| 7,274,397 | B2 | 9/2007 | Fowler |
| 7,459,943 | B2 * | 12/2008 | Yen et al. ........................ 327/91 |
| 8,378,717 | B1 * | 2/2013 | Tsai et al. ........................ 327/95 |
| 2002/0175738 | A1 | 11/2002 | Cyrusian |
| 2007/0013416 | A1 * | 1/2007 | Yen et al. ........................ 327/94 |
| 2011/0148500 | A1 | 6/2011 | Huang |
| 2012/0049951 | A1 | 3/2012 | Venkataraman et al. |
| 2014/0049291 | A1 * | 2/2014 | Soh et al. ......................... 327/94 |
| 2014/0085117 | A1 * | 3/2014 | Hurrell et al. .................. 341/122 |

* cited by examiner

*Primary Examiner* — Ryan Jager

(57) ABSTRACT

A sample and hold circuit and a method for sampling a signal are disclosed. The sample and hold circuit includes first and second switches, first, second, and third capacitors, and an amplifier. The amplifier receives a signal to be sampled on a first input. The first capacitor is characterized by a first capacitance and has a first terminal connected to an output of the amplifier by the first switch. The second capacitor is characterized by a second capacitance and has a second terminal connected to the output of the amplifier by the second switch. The third capacitor connects the first and second terminals. The amplifier is configured to form a capacitive transimpedance amplifier having the third capacitor as a feedback circuit when the first switch is in a non-conducting state and the second switch is in a conducting state.

11 Claims, 2 Drawing Sheets

SAMPLE AND HOLD CIRCUIT WITH REDUCED NOISE

BACKGROUND

Originally, solid state cameras utilized CCD imaging arrays. However, improvements in CMOS based cameras have made CMOS imaging arrays the imaging array of choice for many applications. In CMOS imaging arrays each pixel in the image is created by a corresponding photodiode that measures the light intensity of the image at a corresponding point in the image. The charge is measured by a readout circuit that includes a floating diffusion node that acts as a capacitor on which the accumulated charge can be transferred. Initially, the floating diffusion node is charged to a fixed reset potential. The charge is then transferred to the floating diffusion node which causes the potential on the floating diffusion node to decrease. The potential on the floating diffusion node is then readout and converted to the light intensity value corresponding to that pixel. Variations in the reset potential due to noise introduced by the switching of the floating diffusion node to the reset potential result in the introduction of noise into the light intensity measurement, as the potential is no longer "fixed" at a precisely known value.

To reduce the noise introduced by the reset noise, a technique referred to as correlated double sampling is used. In correlated double sampling, the potential of the floating diffusion node after the floating diffusion node has been reset, but before the charge is transferred from the photodiode is measured and stored in a sample and hold circuit. The charge from the photodiode is then transferred to the floating diffusion node and the potential of the floating diffusion node is measured again. The potential value stored in the sample and hold circuit is then subtracted from the measured potential to arrive at a signal indicative of the amount of charge that was accumulated on the photodiode during the exposure. This technique greatly reduces the problems introduced by variations in the reset potential.

While correlated double sampling reduces the problems associated with variations in the reset potential on the floating diffusion node, the sample and hold circuit introduces a new source of noise into the measurements. The sample and hold circuit typically includes a switch that gates the voltage to be sampled onto a capacitor. When the switch opens after having connected the capacitor to the voltage source, noise from the switch opening alters the voltage on the capacitor by an amount that is proportional to $\sqrt{KT/C}$, where C is the capacitance of the storage capacitor in the sample and hold circuit. In principle, this noise can be reduced by using a large capacitor; however, there is a limit to the size of capacitor that can be provided that is imposed by the available circuit area in the imaging array chip. Hence, a sample and hold circuit that introduces less noise while having a size that is less than or equal to that of the single capacitor is needed.

SUMMARY

The present invention includes a sample and hold circuit and a method for sampling a signal. The sample and hold circuit includes first and second switches, first, second, and third capacitors, and an amplifier. The amplifier receives a signal to be sampled on a first input. The first capacitor is characterized by a first capacitance and has a first terminal connected to an output of the amplifier by the first switch. The second capacitor is characterized by a second capacitance and has a second terminal connected to the output of the amplifier by the second switch. The third capacitor connects the first and second terminals. The amplifier is configured to form a capacitive transimpedance amplifier having the third capacitor as a feedback circuit when the first switch is in a non-conducting state and the second switch is in a conducting state.

In one aspect of the invention, the amplifier includes an operational amplifier with a second input connected to the first terminal when the first switch is in the non-conducting state.

DETAILED DESCRIPTION

Figure 1:
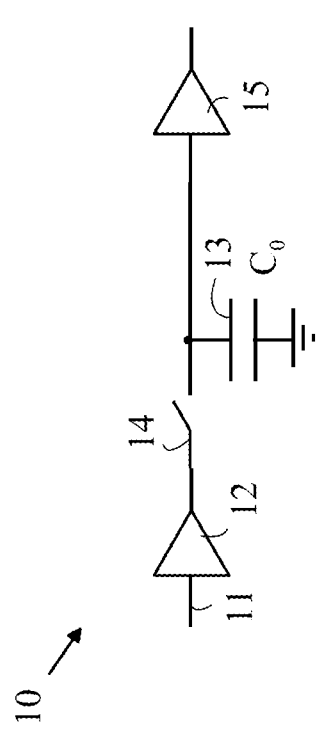
FIG. 1 illustrates a typical prior art sample and hold circuit.

The manner in which the present invention provides its advantages can be more easily understood with reference to FIG. 1, which illustrates a typical prior art sample and hold circuit. A signal on input line 11 is applied to capacitor 13 via buffer 12 when switch 14 is closed. Switch 14 is then opened leaving the signal value stored on capacitor 13. The voltage on capacitor 13 is then read via buffer 15. As noted above, when switch 14 opens, a noise voltage that is proportional to $\sqrt{KT/C_0}$ is introduced into the capacitor 13, where $C_0$ is the capacitance of capacitor 13. With modern integrated circuits, capacitor 13 is the largest component in sample and hold circuit 10. Hence, reducing this noise by increasing the size of capacitor 13 is often impractical.

Figure 2:
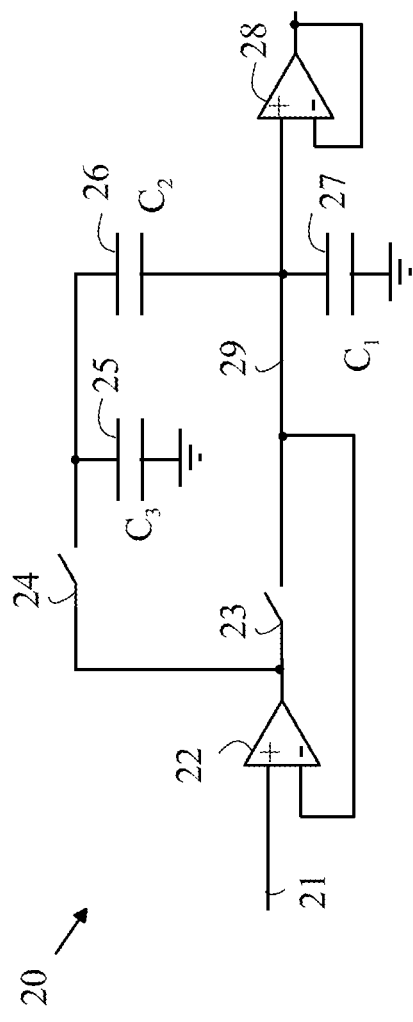
FIG. 2 illustrates one embodiment of a sample and hold circuit according to the present invention.

Refer now to FIG. 2, which illustrates one embodiment of a sample and hold circuit 20 according to the present invention. Sample and hold circuit 20 stores the voltage on input line 21 when switches 23 and 24 are closed. The voltage is stored on capacitor 27 and readout later via buffer 28. Initially, switches 23 and 24 are closed. Hence, the input signal on input line 21 is applied to capacitors 25 and 27. With both switches closed, amplifier 22 acts as a buffer. At this point, the potential on capacitor 25 is exactly the same as that on capacitor 27.

Figure 3:
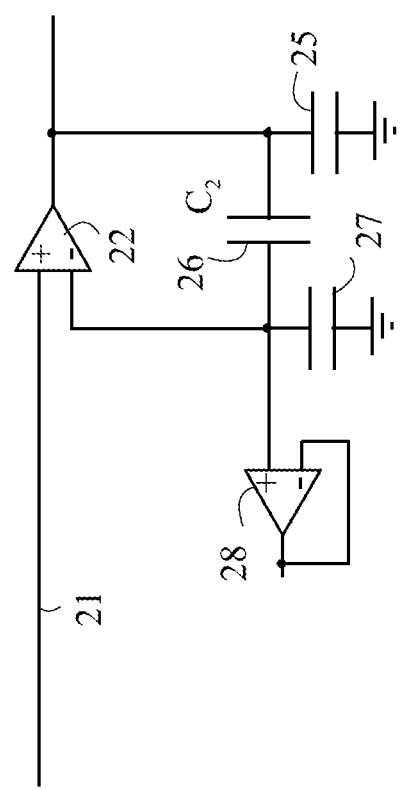
FIG. 3 illustrates the electrical connections when switch 23 is open and switch 24 is closed.

Switch 23 is then opened while switch 24 remains closed. Refer now to FIG. 3, which illustrates the electrical connections when switch 23 is open and switch 24 is closed. When switch 23 is open and switch 24 is closed, amplifier 22 is configured as a capacitive transimpedance amplifier with capacitor 26 as the feedback capacitor. In this configuration, amplifier 22 charges capacitor 26 such that any potential difference between capacitors 27 and 25 is eliminated. When switch 23 is opened, a noise charge is added to, or subtracted from, capacitor 27 giving rise to a difference in potential between capacitor 25 and capacitor 27. Hence, when switch 23 is opened, amplifier 22 moves a charge corresponding to the potential difference between capacitor 25 and capacitor 27 to capacitor 26, thereby eliminating any such difference in potential. Since the difference in potential is the KT/C noise introduced by switch 23 opening, the noise from switch 23 opening is effectively removed from capacitor 27 and transferred to capacitor 26.

Refer again to FIG. 2. Unfortunately, to complete the sampling operation, switch 24 must be opened to prevent signals arriving on input line 21 from corrupting the voltage stored in capacitor 27 via capacitor 26. When switch 24 is opened, $KT/C_3$ noise is added to capacitor 25. However, this noise is divided between capacitor 26 and capacitor 27; hence only a fraction of that noise is added to the voltage on node 29 to corrupt capacitor 27. Accordingly, a net noise reduction is achieved without increasing the area of the circuit devoted to capacitors above that of a conventional sample and hold circuit.

As noted above, a conventional sample and hold circuit with a storage capacitor having capacitance $C_0$ is characterized by noise $KT/C_0$. Sample and hold 20 is characterized by noise power given by $$\frac{KT}{C_3}\left(\frac{C_2}{C_1+C_2}\right)^2$$

To minimize the noise for a given total capacitor area, $C_2$ should be as small as possible. However, there is a limit to the size of $C_2$, since capacitor 26 must store the noise charge generated by the closing of switch 23. However, $C_2$ can still be made much less than $C_1$, since capacitor 26 is only storing the noise signal from capacitor 27; while capacitor 27 is storing the entire signal which is assumed to be much larger than the noise in question. Assuming that $C_3=C_1=C>>C_2$, the noise power is approximately, $$\frac{KT}{C}\left(\frac{C_2}{C}\right)^2$$

Hence, the noise can be substantially reduced without increasing the total size of the area devoted to capacitors. For example, if $C_2=0.1*C_0$, and C is set to 0.9 times $C_0$, where $C_0$ is the size of the capacitor in the conventional sample and hold circuit, then the noise power is reduced by a factor of approximately 90 with the same area devoted to capacitors.

In general, we choose the capacitors such that $C_1+C_2+C_3<=C_0$ and $$\frac{KT}{C_3}\left(\frac{C_2}{C_1+C_2}\right)^2 \le \frac{KT}{C_0}$$

Here, $C_0$ is the maximum capacitance that is available. This is, in general, set by the cost of fabrication. As noted above, it is advantageous to set $C_2$ as small as possible. In general, this will leave an area slightly less than that available in the conventional sample and hold circuit for $C_1$ and $C_3$. In one exemplary embodiment, $C_1=10*C_3$ and $C_2=C_3$.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. A sample and hold circuit comprising:
   an amplifier that receives a signal to be sampled on a first input;
   a first capacitor characterized by a first capacitance and having a first terminal connected to an output of said amplifier by a first switch;
   a second capacitor characterized by a second capacitance and having a second terminal connected to said output of said amplifier by a second switch; and
   a third capacitor that connects said first and second terminals, wherein
   said amplifier is configured to form a capacitive transimpedance amplifier having said third capacitor as a feedback circuit when said first switch is in a non-conducting state and said second switch is in a conducting state.

2. The sample and hold circuit of claim 1 wherein said amplifier comprises an operational amplifier with an inverting input connected to said first terminal when said first switch is in said non-conducting state.

3. The sample and hold circuit of claim 1 wherein said third capacitor has a capacitance that is less than ten percent of said first capacitance.

4. The sample and hold circuit of claim 1 wherein said second capacitance is greater than said first capacitance.

5. The sample and hold circuit of claim 1 further comprising a buffer for outputting a signal related to a potential on said first capacitor.

6. A method for sampling a signal, said method comprising:
   connecting said signal to first and second capacitors by closing first and second switches at the same time, respectively;
   opening said first switch while leaving said second switch closed;
   causing a noise signal generated by opening said first switch to be removed from said first capacitor after said first switch is opened; and
   opening said second switch, wherein
   said second capacitor is coupled to said first capacitor by a network that divides a noise signal generated by opening said second switch between said network and said first capacitor.

7. The method of claim 6 further comprising generating a signal having a signal value determined by a potential on said first capacitor after said first and second switches have been opened.

8. The method of claim 6 wherein said network comprises a third capacitor that is connected between said first and second capacitors, said noise signal generated by opening said first switch being transferred to a signal across said third capacitor when said first switch is open and said second switch is closed.

9. The method of claim 6 wherein said third capacitor has a capacitance that is less than ten percent of said first capacitance.

10. The method of claim 6 wherein said second capacitance is greater than said first capacitance.

11. The method of claim 6 further comprising a buffer for outputting a signal related to a potential on said first capacitor.

\* \* \* \* \*